United States Patent [19]
Hanoka

[11] Patent Number: 5,698,451
[45] Date of Patent: Dec. 16, 1997

[54] METHOD OF FABRICATING CONTACTS FOR SOLAR CELLS

[75] Inventor: Jack I. Hanoka, Brookline, Mass.

[73] Assignee: Mobil Solar Energy Corporation, Billerica, Mass.

[21] Appl. No.: 448,033

[22] Filed: May 23, 1995

Related U.S. Application Data

[63] Continuation of Ser. No. 889,159, May 27, 1992, abandoned, which is a continuation-in-part of Ser. No. 607,883, Nov. 1, 1990, abandoned, which is a continuation-in-part of Ser. No. 205,304, Jun. 10, 1988, abandoned.

[51] Int. Cl.$^6$ .................................................. H01L 31/18
[52] U.S. Cl. ............................ 437/2; 437/4; 437/180; 437/203; 437/228
[58] Field of Search ..................... 437/2, 4, 180, 437/203, 228

[56] References Cited

U.S. PATENT DOCUMENTS

| | | | |
|---|---|---|---|
| 4,235,644 | 11/1980 | Needes | 136/256 |
| 4,256,513 | 3/1981 | Yoshida et al. | 136/256 |
| 4,293,451 | 10/1981 | Ross | 252/512 |
| 4,347,262 | 8/1982 | Marcus | 427/74 |
| 4,375,007 | 2/1983 | Marcus | 136/256 |
| 4,388,346 | 6/1983 | Bickler | 427/58 |
| 4,534,099 | 8/1985 | Howe | 29/272 |
| 4,602,120 | 7/1986 | Wakefield et al. | 136/256 |
| 4,640,001 | 2/1987 | Koiwai et al. | 29/572 |
| 4,643,913 | 2/1987 | Okunaka et al. | 427/75 |
| 4,737,197 | 4/1988 | Nagahara et al. | 136/256 |
| 4,751,191 | 6/1988 | Gonsiorawski | 437/2 |

OTHER PUBLICATIONS

PCT Publication WO 89/07343 of Aug. 10, 1989 "Method for Making A Silver Electrode on a Silicon Photovoltaic Cell".

Mertens et al "Critical Processing Parameter Optimization for Screen Printed Semicrystalline Silicon Solar Cells" 1984 IEEE.

Spectrolab, Inc. Final Report, Aug. 1980 Under JPL Contract 954853 entitled "Investigation Of Proposed Process Sequence For The Array Automated Assembly Task"—Phases I & II—Title Page and pp. 140 and 163.

Copy of brochure of Transene Company, Inc. for "N–and P–Diffusol For Semiconductor Technology".

Copy of brochure by Thick Film Systems entitled "Thick Film Screen Printable Silver Conductor Pastes", Bulletin C–332–1 (1979).

"Thick–Film Metallization For Solar Cell Applications", IEEE Transactions on Electron Devices, Cheek et al. vol. ED–31, No. 5, May 1984.

"Developments In Polycrystalline Silicon Solar Cells And A Novel Form Of Printed Contact", Haigh, International Conference on Solar Electricity, France (1976).

"Fired Through Printed Contacts On Anti–reflection Coated Silicon Terrestrial Solar Cells", Haigh. Presented at 12th IEEE PVSC Meeting (1976).

"High Performance BSF Silicon Solar Cells With Fire Through Contacts Printed on AR Coating", Nunoi et al. presented at 14th IEEE PVSC Meeting (1980).

"An Advanced Solar Cell Production Line Based On LSSA Funded Processes", Godfrey et al. presented 15th IEEE PVSC meeting (1982).

"A New Process For High Efficiency Silicon Solar Cells", Nakatani et al, presented at 17th IEEE PVSC meeting (1984).

*Primary Examiner*—David Graybill
*Attorney, Agent, or Firm*—Pandiscio & Pandiscio

[57] ABSTRACT

A solar cell fabrication procedure is described in which a silicon substrate having a layer of silicon nitride on one side is selectively coated with a paste that contains silver metal and a glass frit. Upon heating to a temperature in excess of 760 degrees C. for a time not exceeding about 20 seconds, the glass penetrates the silicon nitride and the substrate surface is metallized by the silver metal, with the result that the finished solar cell has a fill factor of at least about 0.75 even though the paste contains no phosphorus.

17 Claims, 2 Drawing Sheets

METHOD OF FABRICATING CONTACTS FOR SOLAR CELLS

This is a continuation of copending application Ser. No. 07/889,159 filed on 27 May 1992, now abandoned, which is a continuation-in-part of application Ser. No. 07/607,883, filed 1 Nov. 1990, now abandoned which in turn is a continuation-in-part of application Ser. No. 07/205,304, filed 10 Jun. 1988, now abandoned.

This invention relates to the manufacture of solid state semiconductor devices. More particularly, the invention relates to an improved process for forming a conductive metal contact on the front side of a silicon wafer coated with silicon nitride.

BACKGROUND OF THE INVENTION

Heretofore a common method of fabricating silicon solar cells has included the steps of: (1) diffusing phosphine into p-type silicon ribbon so as to form a shallow junction, (2) forming on the junction side of the ribbon a thin coating of silicon nitride, (3) forming a grid electrode pattern in the silicon nitride coating by photolithography (using a suitable photoresist composition and etching), (4) coating the other side of the silicon ribbon with an aluminum paste, (5) heating the silicon so as to alloy the aluminum and silicon, (6) plating exposed silicon on both sides of the ribbon with nickel, (7) sintering the nickel to form a nickel silicide, and (8) plating additional metal(s) onto the metal covered portions of the silicon. A more detailed description of such a process can be found in U.S. Pat. No. 4,451,969, issued Jun. 5, 1984 to Arup R. Chaudhuri for "Method Of Fabricating Solar Cells".

The steps of forming a grid electrode by photolithography, which necessarily involves removal of residual resist, is extremely effective. However, photolithography involves several time consuming steps and adds a disproportionally high share to the overall cost of forming solar cells.

Illustrating the state of the prior art are U.S. Pat. Nos. 4,375,007, 4,388,346 and 4,640,001, and the references cited therein. U.S. Pat. No. 4,375,007 discloses a silicon solar cell with aluminum-magnesium alloy low resistance contacts. The Al—Mg alloy is mixed with Ni—Sb alloy or Al, in powder form, to form a thick-film metallizing paste useful for making low resistance electrically conductive contacts to a silicon solar cell coated with $Si_3N_4$.

U.S. Pat. No. 4,388,346 discloses electrodes for solid state devices. The electrodes are formed by screen-printing through a mask a pattern of ink containing a dispersion of lower melting, sinterable metal coated base metal particles dispersed in a liquid vehicle including a vaporizable binder polymer and a fluorocarbon polymer. On firing the screen-printed device, the coated metal particles sinter without being oxidized to form a contact electrode. An anti-reflection coating is then applied to the cell.

U.S. Pat. No. 4,640,001 (Koiwai et al) discloses a solar cell manufacturing method in which a silicon wafer is coated with an anti-reflection coating of silicon nitride by means of plasma CVD deposition at a temperature between 250 degrees C. and 600 degrees C. The patent indicates that the silicon nitride coating makes the surface of the silicon cell unacceptable for firing screen-printed electrodes. Therefore, the coating is partially removed by etching in the regions where the electrodes are to be formed to insure that the electrodes will bond to the silicon wafer.

At the time this invention was conceived, it was widely recognized that widespread use of photovoltaic solar cells was dependent upon the development of fabrication techniques capable of producing reliable solar cells with a conversion efficiency of 12% or higher at a relatively low cost. The cost of solar cells, like other semiconductor devices, depends on the cost of the starting materials and the cost of converting the starting materials into the finished product. The conversion of silicon into at least 12% efficient silicon solar cells at low cost cannot be accomplished without a suitable low-cost metallization technique for forming the grid electrode.

U.S. Pat. No. 4,737,197, issued Apr. 12, 1988 to Y. Nagahara et al for "Solar Cell With Metal Paste Contact", discloses a method of making front contacts on silicon solar cells by firing a silver paste through a $TiO_2$ anti-reflection layer. That patent discloses that solar cells having a fill factor as high as 0.75 may be attained if between about 0.05 and about 0.3 wt. % of elemental phosphorus or a phosphorus compound is included in a silver paste comprising silver particles, an organic binder and a solvent that is used to print a front contact on a silicon substrate, and the substrate and silver paste are fired at a temperature of between about 600 and about 700 degrees C. The patent also alleges that the energy conversion efficiency is improved by the claimed invention, but does not indicate what magnitude of conversion efficiency is achieved by that invention.

It also is known that after-treating a silver front contact by immersing it in an aqueous hydrogen fluoride solution for a brief period of time, e.g., 15–20 seconds, will reduce the front contact resistance and enhance the solar cell's fill factor and efficiency. However, it also is known that the resulting fill factor tends to be unstable when subjected to repetitive environmental life tests, with the result that both the cell fill factor and the cell efficiency will drop when the cell is exposed to above room temperatures (room temperature is considered to be 25 degrees C.), e.g., to a temperature of 60–100 degrees C.

In the development of this invention two discoveries were made: (1) fill factors of 0.75 and higher may be obtained for cells comprising polycrystalline silicon substrates having front contacts made by firing a silver paste through a silicon nitride anti-reflection ("AR") coating using silver pastes that do not contain phosphorus; and (2) the task of maximizing the fill factor for solar cells in which the front grid contact is formed by firing a silver paste through a silver nitride anti-reflection coating is limited by a narrow processing window, with the window being characterized by firing the substrate to a temperature in excess of 760 degrees C., preferably in the range of between about 780 degrees C. to about 810 degrees C., for a brief period of time. By (a) using such a firing temperature, and (b) using a suitable silver paste (with or without phosphorus), it is possible to repetitively produce polycrystalline silicon solar cells having fill factors in the range of 0.75–0.79.

OBJECTS OF THE INVENTION

Accordingly, the primary object is to provide an improved low cost processing sequence for the fabrication of solar cells in which a metal paste is fired through a silicon nitride layer on a silicon solar cell substrate to form a conductive contact.

Another object of this invention is to provide an improved low cost method of making photovoltaic semiconductor junction devices in which a silver-rich metal paste or ink is fired through a silicon nitride coating on a solar cell substrate to form a conductive contact with the substrate, while leaving the surrounding silicon nitride to serve as an anti-reflection layer and also as an environmental protector for the substrate.

An additional object of this invention is to provide an improved method of fabricating a contact on the front surface of a silicon solar cell coated with a silicon nitride layer without (a) etching a grid pattern in the silicon nitride layer in preparation for application of the front contact, and (b) degradation of cell performance in the course of contact formation.

Another object of this invention is to provide an improved method of making silver front contacts on silicon solar cells having silicon nitride AR coatings which is less expensive but no less reliable than prior methods of forming silver contacts, and which also permits attainment of silicon solar cells with characteristics as good as those made using etching and electroless plating techniques and superior to those made using prior firing-through techniques.

The invention achieves the foregoing objects by a solar cell contact fabrication procedure of the character described which involves the following steps: (1) providing a silicon substrate which has a p-n junction and a layer of silicon nitride on its front surface adjacent the junction, (2) selectively coating the silicon nitride layer with a paste or ink that contains silver particles and a glass frit, so that the coating forms a selected contact pattern on the silicon nitride, and (3) heating the substrate to a temperature in excess of 760 degrees C., preferably in the range of 780 to 810 degrees C., for a time sufficient to rapidly and efficiently cause the silver/glass frit coating to penetrate the silicon nitride layer and form an ohmic contact on the front surface of the substrate. The novel method may be practiced with a silicon solar cell substrate which already has a back ohmic contact or the latter contact may be formed after the front surface contact has been formed.

One embodiment of the invention involves, inter alia, the following steps: (1) providing a silicon substrate which has a p-n junction and a layer of silicon nitride on the front surface, (2) coating the back side of the silicon substrate with an aluminum paste, (3) heating the silicon substrate to rapidly and efficiently cause the aluminum to form an adherent conductive back side contact, (4) coating the silicon nitride with a paste containing silver particles and glass frit so as to form a grid-shaped electrode pattern on the silicon nitride, and (5) heating the substrate to a temperature in excess of 760 degrees C., preferably 780 to 810 degrees C., for a period of time sufficient to cause the metal and frit components in the paste to penetrate the silicon nitride layer and form an adherent conductive front side contact. Thereafter the substrate may be further processed, e.g., to prepare it for connection to electrical circuits.

A second and preferred embodiment involves a single firing step. In this case, the aluminum paste is dried but not fired before step (4) above, i.e., before the silver/glass frit paste is coated onto the silicon nitride layer, and in-step (5) the firing causes the aluminum in the aluminum paste to alloy with the silicon substrate so as to form an adherent conductive back contact.

The silver-containing paste that is fired into the substrate to form the front grid-type contact must have the following characteristics. First, it must be capable of rapidly penetrating the silicon nitride layer at relatively low temperatures at which the solar cell integrity is not destroyed, i.e., substrate temperatures below about 830 degrees C., which is the temperature at which silver tends to alloy with silicon. Second it must not penetrate the silicon substrate so as to alter its p-n junction, and thus degrade cell performance. Third, the firing of the silver paste must not cause the silicon nitride layer to crack during thermal treatment. Fourth, the firing must not significantly alter the ability of the silicon nitride layer to act as an anti-reflection element.

Other objects of the invention will in part be obvious and will in part appear hereinafter. Accordingly, the invention comprises the several steps, and the relationship of one or more of such steps with respect to each of the others, which are exemplified in the following detailed disclosure, and the scope of the invention is as indicated by the following claims.

BRIEF DESCRIPTION OF THE DRAWINGS

For a fuller understanding of the nature and objects of the present invention, reference should be had to the following detailed description which is to be considered together with the accompanying drawings, wherein.

Throughout the drawing, like reference numbers refer to similar structure.

Figure 1:
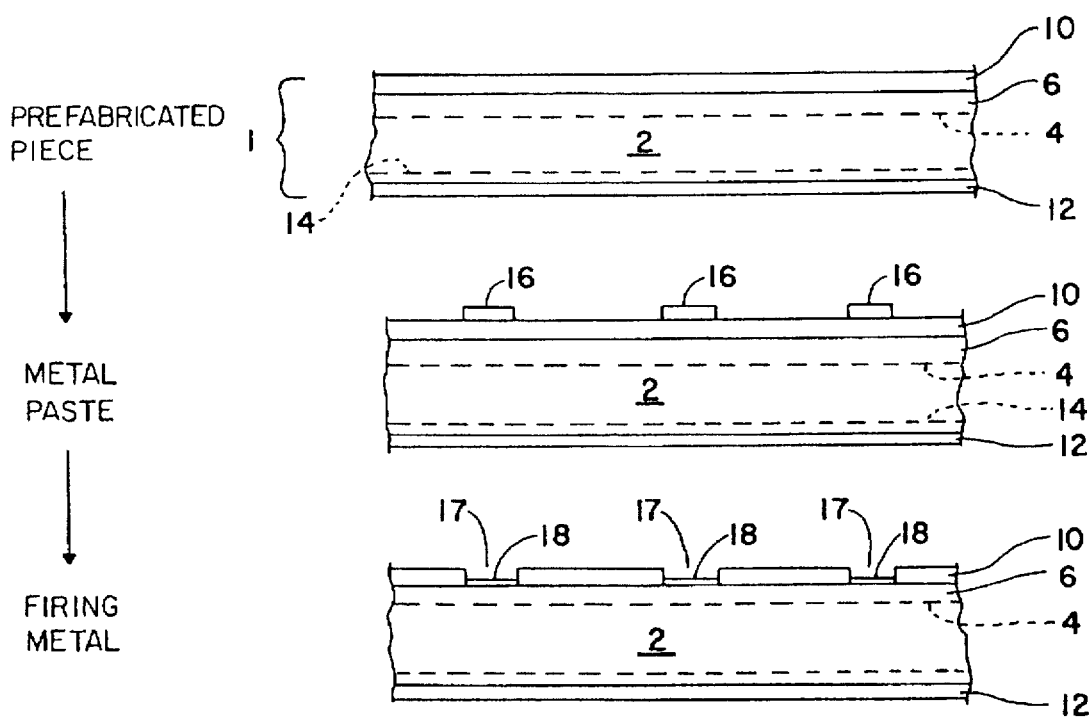
FIG. 1 is a diagrammatic representation of certain steps involved in making solar cells according to the invention.

In the drawing, the thicknesses and depths of the several coatings and regions are neither shown to scale nor shown exactly in accordance with their relative proportions, for convenience of illustration.

DETAILED DESCRIPTION OF THE INVENTION

Referring now to the drawings, FIG. 1 illustrates an embodiment of the invention that relates to the production of solar cells from EFG grown p-type silicon ribbon. For this embodiment, there is provided as a starting piece a partially finished cell 1. Partially finished cell 1 has a substrate 2, preferably comprising a length of p-type conductivity silicon ribbon, one side (hereafter the "front side") of which has been provided with a relatively shallow junction 4 (e.g., a junction of between about 3,000 and about 7,000 Angstrom units deep), an n-type (typically $n^+$) conductivity region 6, and a silicon nitride layer 10. The other side (hereinafter the "rear side") of the substrate is provided with a contact in the form of a layer of aluminum 12 alloyed to the substrate, and a $p^+$ region 14. The $p^+$ region 14 preferably has a depth of from about 1 to about 8 microns.

Partially finished cell 1 may be fabricated by any of a number of means well known in the art. For instance, junction 4 and $n^+$ conductivity region 6 may be formed in a p-type silicon substrate 2 by the diffusion of phosphorus. Layer 12 and $p^+$ region 14 may be formed by coating the rear side of the substrate with a layer of an aluminum paste comprising aluminum powder in a volatile organic vehicle, e.g., a vehicle comprising a binder such as ethyl cellulose or methyl cellulose and a solvent such as "TERPINEOL" or "CARBITOL" that can be removed by evaporation or combustion, and then heating the substrate to remove any volatile or pyrolyzable organic components of the paste and to alloy the aluminum to the substrate and form the $p^+$ region. However, other forms of substrate, junction, and rear electrode, and other methods of fabrication, may equally well be employed to provide partially finished cell 1.

Of course, the process provided by this invention is not limited to the production of solar cells from EFG substrates. Thus, for example, cast polycrystalline substrates, epitaxial silicon on metallurgical grade silicon or fine grade polysilicon layers formed by chemical or physical vapor deposition can be used to form solar cells using the present invention. Further, the process is applicable to single crystal silicon. Then, too, the process may be practiced with n-type as well as p-type material. Also, the invention may be applied to substrates other than ribbons or similar flat stock, e.g., circular pieces of material or substrates having an arcuate or polygonal cross-section.

Starting with such a prefabricated piece as shown in FIG. 1, the front side is coated with a paste 16 containing silver particles, a frit of a lead borosilicate glass, and an organic vehicle, e.g., a vehicle comprising an organic binder such as ethyl cellulose or methyl cellulose and a solvent such as "TERPINEOL", "CARBITOL" (diethylene glycol monoethyl ether), or ethylene glycol monoethyl ether. The silver paste also may contain phosphorus as described in U.S. Pat. No. 4,737,197, supra, but according to the present invention the presence of phosphorus in the paste is not necessary in order to get a fill factor of at least 0.75. Hence it is to be understood that the invention also may be practiced using silver pastes that are free of phosphorus and that such practice can provide photovoltaic solar cells having a fill factor of at least 0.75.

The silver paste is applied according to a predetermined electrode pattern, e.g., in the form of a grid electrode comprising a plurality of narrow fingers attached at one end to a bus bar or runner. One form of suitable grid electrode is illustrated in U.S. Pat. No. 3,686,036. Paste 16 may be applied using any of the known techniques which are commonly used in the electronics industry. Screen printing and direct write-on coating techniques are satisfactory. Pad printing also may be used.

Once paste 16 has been applied and dried it is ready to be fired. The firing is conducted in a furnace with an oxygen atmosphere. The firing temperature may vary, but in any case it should be adequate to volatize or pyrolyze the organics and melt the glass frit until the frit fires through the silicon nitride layer 10. The time in the furnace will vary with the firing temperature. Generally the overall time in the furnace may be between 2 and 10 minutes, depending upon the "ramp-up" and "ramp-down" times, i.e., the times required to (a) heat the substrate up to the firing temperature and (b) cool the substrate down from the firing temperature to a temperature where it can be handled for subsequent cooling to room temperature and/or storage or other subsequent manufacturing operations. The concentration of metal, glass frit and organics in paste 16 may vary. Preferably, however, the paste consists of 50 to 75 wt. % metal, 4 to 30 wt. % glass frit, and 10–25 wt. % organics (i.e., organic vehicle). Most preferably, the paste has only about 5 wt. % glass frit. The glass frit comprises 5–80% lead, 1 to 40% silicon oxide and 1–30% boron oxide in the case of a lead borosilicate glass. If the paste contains phosphorus or a phosphorus compound, the phosphorus is present in an amount equal to between about 0.50 and about 3.0 wt % (computed on the basis of elemental phosphorus) of the paste.

Temperatures above 700 degrees C. have been used for firing silver/glass frit pastes through silicon nitride layers so as to form silver contacts, but I have determined that there is a narrow firing temperature window that permits superior results. More particularly, superior results are surprisingly obtained if the silver paste is fired to a peak temperature in excess of 760 degrees C. and is held at that temperature for a time in the range of 1 to 20 seconds, with the firing time decreasing with increasing peak temperature. Preferably the substrate is heated to a temperature of 780–810 degrees C., more preferably 790–800 degrees C., for 1 to 6 seconds. The firing is conducted so that the substrate is at a temperature above 760 degrees C. for a time of at least 5 and not more than about 20 seconds, preferably for no more than about 12 seconds.

During firing the organics in paste 16 volatize or burn off, the glass frit becomes fluid and fires through the silicon nitride layer 10, and the conductive silver metal and glass frit bond to the front surface of the substrate, forming ohmic contact 18.

In an alternate preferred embodiment, the rear side of the substrate has been coated with an aluminum paste. In this embodiment, the firing of the metal paste through silicon nitride layer 10 on the front side is accomplished simultaneously with firing of the aluminum paste to alloy aluminum to the rear side of the silicon substrate. As a further alternative, heating the substrate to alloy the aluminum may be conducted before the metal paste has been coated on the silicon nitride layer.

The aluminum paste preferably comprises between about 50 and 70 wt. % aluminum particles and a vehicle comprising an organic binder such as ethyl cellulose or methyl cellulose and a solvent such as Carbitol or terpineol blended to provide the paste with a viscosity suitable for printing the paste onto the solar cell blank. Commercially available pastes may be used. By way of example, a suitable paste for pad printing the back contact is achieved by diluting "Ferro FX53-015" aluminum paste, made by Ferro Company of Santa Barbara, Calif., with between 10–25 wt. % of a solvent such as "CARBITOL" or "TERPINEOL".

The following example illustrates one mode of practicing the invention.

EXAMPLE I

A partially finished cell of p-type EFG-grown silicon ribbon is provided having a conductivity of about 1–5 ohm-cm. The cell has a shallow p-n junction about 6,000 angstroms deep, and a silicon nitride layer of about 800 angstroms on its front surface. The rear side of the cell has a layer of aluminum alloyed to the silicon.

A layer of silver-containing paste is selectively screen printed onto the silicon nitride layer. The layer of paste is patterned as a multi-fingered grid electrode having the form illustrated in U.S. Pat. No. 3,686,036. The paste contains a mixture of silver metal in particle form, a lead borosilicate glass frit and a liquid organic vehicle comprising an organic binder such as ethyl cellulose and an organic solvent such as "TERPINEOL" or "CARBITOL". The glass frit contains 5–80% lead, 5–30% boron oxide, and 5 to 40% silicon oxide. The silver metal, the glass frit and the vehicle constitute about 70–75 wt. %, 5 wt. % and 10–25 wt. % respectively of the paste.

Once the paste has dried (which may but need not involve heating the paste to evaporate any volatile vehicle), the silicon substrate is passed into an air furnace and heated in air to a temperature of about 800 degrees C. It is held at that firing temperature for about 4 seconds. Then it is removed from the furnace and allowed to cool to room temperature. The overall time in the furnace is about 2 minutes. The firing step has been found to be sufficient to cause any organics in the paste to volatize and burn and the lead borosilicate glass frit to become sufficiently fluid to fire through the silicon nitride coating and bond to the front surface of the silicon substrate. The glass frit carries the silver with it and permits the silver to make an ohmic contact with the substrate.

EXAMPLE II

This example illustrates a preferred embodiment of the invention which is termed the "single fire" mode of practicing the invention, since in this case the aluminum contact is formed by firing the aluminum paste simultaneously with firing the silver paste. In this case a partially finished cell is provided that comprises a p-type, EFG grown polycrystalline silicon substrate having a conductivity of about 1–5 ohm-cm, and a thickness of 12–16 mils (0.012–0.016 inch), with a shallow p-n junction being formed about 0.5 microns below the front surface of the substrate by diffusion or some other suitable junction-forming process. Additionally a silicon nitride AR coating about 800 angstroms thick is disposed in overlying and adherent relation with the front surface of the substrate 4. The AR coating is formed by a plasma deposition process, e.g., substantially according to the method described in U.S. Pat. No. 4,751,191.

This substrate is treated by coating its rear surface with a layer of an aluminum paste consisting of "FERRO FX53-015" aluminum metal paste diluted by adding between about 10–25 wt. % of "CARBITOL", with the aluminum metal paste being applied centrally on the rear surface of the substrate 4 by a suitable printing technique, e.g., preferably pad printing. The aluminum paste is applied so that the coating thereof on the rear surface of the substrate has an aluminum content of about 5–8 mg per $cm^2$ of coated surface. The aluminum paste is then dried at 150 degrees C. for 2–4 minutes in air.

Then a silver metal/glass frit paste is printed onto the silicon nitride coating in a grid contact pattern. The paste comprises Ferro silver/glass frit paste "#3349". The metal/glass frit paste is applied so as to provide (1) a silver content of about 10 mg/$cm^2$ on the silver-coated area of the substrate, and (2) a grid contact having a thickness (height) in the order of 30 microns after the cell has been fired.

Thereafter, the silicon blank is fired in an oxygen-containing atmosphere in a radiant-heated belt furnace for a period such that the substrate reaches a peak temperature of about 790 degrees C. and is held at that peak temperature for between about 1 and 6 seconds, after which it is cooled rapidly. The exit zone of the furnace has a temperature of about 100–125 degrees C., and the conveyor belt is moved at a speed whereby the substrate is in the furnace long enough to ramp the substrate up to its peak temperature and ramp it back down to about 100–125 degrees C. as it leaves the furnace. This firing procedure causes the aluminum content of the aluminum paste to alloy with the silicon substrate and form an ohmic contact, and also causes the silver/glass frit paste to etch through the AR coating and form a silver grid contact substantially as represented in FIG. 1. The resulting cell has an aluminum metal contact with a thickness of 20–30 microns and a $P^+$ region in the substrate adjacent the aluminum metal contact having a depth (thickness) of about 5–8 microns. The fired silver grid contact has a thickness (height) in the order of 30 microns.

Figure 2:
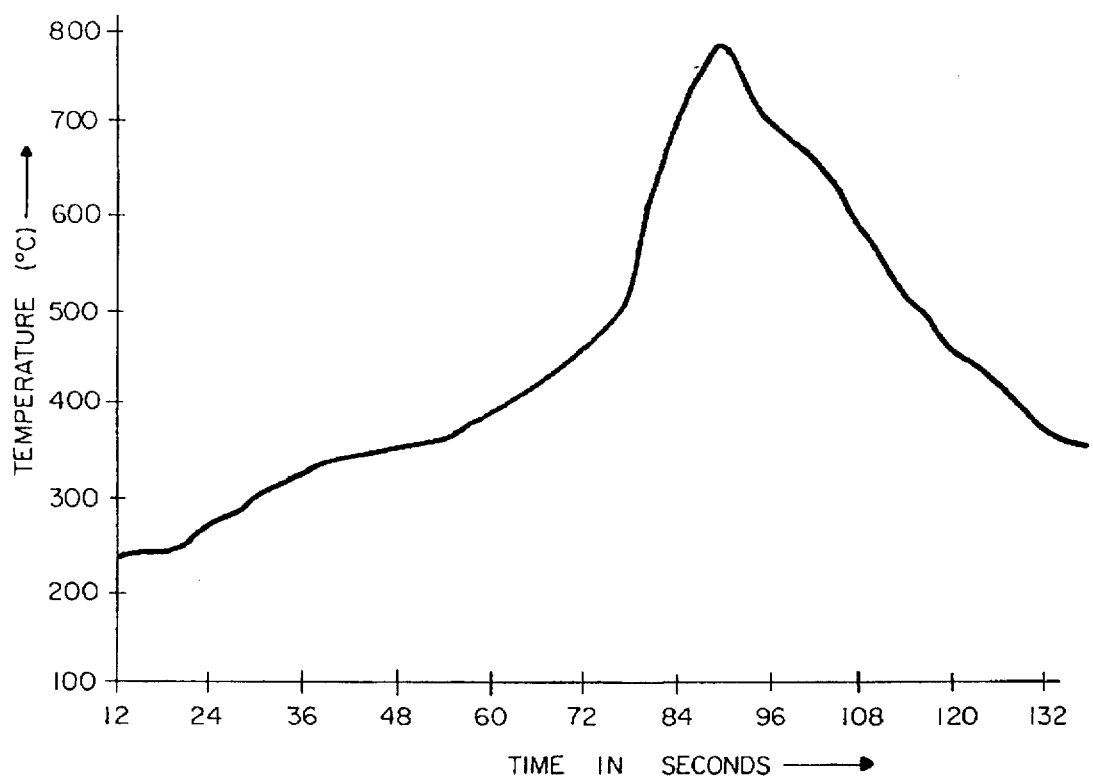
FIG. 2 is a diagram illustrating the change in substrate temperature versus time as the substrate undergoes firing in accordance with this invention.

FIG. 2 graphically illustrates the change in temperature of the substrate as it is fired according to the foregoing examples. As can be seen from FIG. 2, the substrate undergoes a rapid increase in temperature up to a maximum temperature of about 790 degrees C., and then its temperature is decreased rapidly but substantially uniformly as it is cooled. It is preferred that the substrate be maintained at a temperature of 700 degrees C. or higher for a period of 5–20 seconds. For best results, the substrate is held at a temperature of 700 degrees C. or higher for about 12 seconds as shown in FIG. 2.

EFG substrate solar cells having silver contacts formed according to the present invention have been tested and have yielded pleasant results. Cells have been made using a silver paste containing phosphorus and also a silver paste containing no phosphorus, with generally comparable results. It has been established that cells may be made according to this invention with fill factors of at least 0.75 whether or not phosphorus is present in the silver paste. Thus, for example, a group of solar cells made according to this invention using a silver paste containing a lead borosilicate glass frit and no elemental phosphorus were found to have the following average parameters: an open circuit voltage ($V_{oc}$) of 577 mv, a short circuit current density ($J_{sc}$) of 28.2 ma/sq. cm., an efficiency of 12.33% and a fill factor of 0.758.

Other cells have been made according to this invention using silver pastes that contain between 0.05 and 0.3 wt. % elemental phosphorus, and such cells have exhibited values as follows: an average open circuit voltage ($V_{oc}$) of 576 mv, an average short circuit current density ($J_{sc}$) of 28.7 ma/sq. cm., efficiencies in the range of 12.7%–13.3%, and a fill factor in the range of 0.77–0.79. The foregoing values are comparable to or better than results obtained with current processing methods which use etching and plating techniques to form silver ohmic contacts on silicon substrates.

Silicon nitride remaining on the front side of the finished devices serves as an effective anti-reflective coating. In this connection it is to be noted, as previously mentioned, that the silicon nitride coating does not crack during the thermal treatment involved in the heating step.

It should be noted that the back contact may be made of silver instead of aluminum when the front contact is made of silver. More particularly the back contact may be made using a silver paste that contains a small amount of aluminum. The back contact may be applied immediately after application of the paste defining the front contact has been applied and dried.

The invention also is applicable to the case where the rear side of the substrate is provided with an aluminum rear contact having "windows" that are occupied by silver soldering pads, with the latter being bonded to the rear surface of the substrate and also to surrounding portions of the aluminum contact, as disclosed by U.S. Pat. No. 5,118,362, filed Jun. 2, 1992 to D. A. St. Angelo et al for "Electrical Contacts And Method Of Manufacturing Same".

Since these and other changes may be made in the above processes without departing from the scope of the invention herein involved, it is intended that all matter contained in the above description or shown in the accompanying drawing shall be interpreted as illustrative. The present invention is indicated by the broad general meaning of the terms in which the appended claims are expressed.

What is claimed is:

1. A method of fabricating a solid state photovoltaic solar cell comprising in sequence the steps of:
   (a) providing a polycrystalline silicon substrate having (1) oppositely-facing first and second surfaces, (2) a p-n junction adjacent said first surface, and (3) a layer of silicon nitride on said first surface;
   (b) selectively covering said layer of silicon nitride with a paste containing (1) silver in particle form, (2) a glass frit consisting essentially of a borosilicate glass and (3) an organic vehicle so as to define a front contact pattern; and
   (c) heating said substrate in an oxygen-containing atmosphere to a temperature in excess of 760 degrees C. but not in excess of 810 degrees C. for a period of time not exceeding about 20 seconds, said heating being conducted so that said paste will not diffuse into the substrate and alter said p-n junction.

2. A method according to claim 1 wherein said glass frit is a lead borosilicate glass.

3. A method according to claim 1 wherein an aluminum-containing paste is applied to said second surface before step (c), and said heating step (c) causes said aluminum-containing paste to form an ohmic aluminum contact at said second surface.

4. A method according to claim 3 in which said heating step (c) is accomplished in a furnace under ambient air.

5. A method according to claim 1 characterized in that an aluminum metal contact is provided on said second surface before steps (b) and (c).

6. A method according to claim 1 wherein heating step (c) is characterized by heating said substrate to a temperature of about 780–810 degrees C.

7. A method according to claim 6 in which heating step (c) is characterized by heating said substrate to a temperature of about 800 degrees C. for 1–6 seconds.

8. A method according to claim 1 wherein said paste is free of phosphorus.

9. A method according to claim 1 wherein said paste contains phorphorus.

10. A method of fabricating a solid state photovoltaic solar cell comprising in sequence the steps of:

(a) providing a polycrystalline silicon substrate having oppositely-facing first and second surfaces, a p-n junction adjacent said first surface, and a layer of silicon nitride on said first surface;

(b) applying a coating of a first aluminum-containing paste to said second surface;

(c) selectively covering said layer of silicon nitride with a second paste so as to define a front contact pattern, said paste comprising at least 50 wt. % silver and 4 to 30 wt. % glass frit; and (d) firing said substrate to a temperature of 780–810 degrees C. in an oxygen-containing environment for a period of time not exceeding 20 seconds sufficient to (1) cause the aluminum in said aluminum-containing paste to alloy with said substrate so as to form an ohmic aluminum contact on said second surface, and (2) cause said glass frit to penetrate said silicon nitride so that said silver particles will engage and form a patterned ohmic contact with said first surface, whereby the resulting solar cell will have a fill factor of at least about 0.75, said firing step being conducted so that components of the second paste will not penetrate into the substrate so as to alter the p-n junction.

11. A method according to claim 10 wherein said firing is accomplished in an air furnace, and the substrate is retained in the furnace for up to about 10 minutes, including the time that the substrate is held at said temperature of 780 to 810 degrees C. and the time required to heat said substrate up to that temperature.

12. A method according to claim 11 wherein in firing step (d) said substrate is at a temperature in the range of 780–810 degrees C. for maximum of 6 seconds.

13. A method according to claim 3 further characterized in that in step (c) said substrate is heated to a temperature of 780–810 degrees C. and held at that temperature for not more than about six seconds.

14. A method according to claim 13 further characterized in that step (c) is conducted in a furnace having an oxygen-containing atmosphere, and after step (c) said substrate is cooled to a temperature of 100–125 degrees C. before removal from said furnace.

15. A method according to claim 14 wherein said substrate is produced by the EFG crystal growing method.

16. A method according to claim 10 wherein said substrate produced by the EFG crystal growing method.

17. A method of forming a silver front contact and an aluminum rear contact on a solar cell substrate comprising the steps of:

(a) providing a polycrystalline silicon substrate having oppositely-facing first and second surfaces, a p-n junction adjacent said first surface, and a layer of silicon nitride on said first surface, said p-n junction being at a depth of about 6000 Angstroms from said first surface and said silicon nitride layer having a thickness of about 800 Angstroms;

(b) applying a coating of an aluminum-containing paste to said second surface;

(c) selectively covering said layer of silicon nitride with a silver paste comprising at least 50 wt. % in silver in particle form and 4 to 40 wt. % glass frit, so as to define a contact pattern; and (d) firing said substrate in an oxygen-containing atmosphere to a temperature of 780–810 degrees C. and holding said substrate at said temperature for a period not exceeding 20 seconds so as to (1) cause the aluminum in said aluminum-containing paste to alloy with said substrate and thereby form an ohmic aluminum contact on said second surface, and (2) cause said glass frit to penetrate said silicon nitride so that said silver particles will engage and form a patterned ohmic contact with said first surface, said firing step being conducted so that components of the silver paste will not penetrate into the substrate far enough to alter the p-n junction.

* * * * *

UNITED STATES PATENT AND TRADEMARK OFFICE
CERTIFICATE OF CORRECTION

PATENT NO. : 5,698,451
DATED : December 16, 1997
INVENTOR(S) : Jack I. Hanoka

It is certified that error appears in the above-indentified patent and that said Letters Patent is hereby corrected as shown below:

Claim 16, column 10, line 19, insert the word "is" before the word -- produced --.

Signed and Sealed this

Seventh Day of April, 1998

Attest:

BRUCE LEHMAN

*Attesting Officer*     *Commissioner of Patents and Trademarks*